(12) United States Patent
Sakai

(10) Patent No.: US 11,218,083 B2
(45) Date of Patent: Jan. 4, 2022

(54) SEMICONDUCTOR DEVICE AND METHOD FOR DRIVING THE SAME

(71) Applicant: Mitsubishi Electric Corporation, Tokyo (JP)

(72) Inventor: Shinji Sakai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 271 days.

(21) Appl. No.: 16/132,095

(22) Filed: Sep. 14, 2018

(65) Prior Publication Data

US 2019/0140634 A1    May 9, 2019

(30) Foreign Application Priority Data

Nov. 9, 2017   (JP) .............................. JP2017-216069

(51) Int. Cl.
*H02M 7/493*    (2007.01)
*H02M 1/088*    (2006.01)
(Continued)

(52) U.S. Cl.
CPC ........... *H02M 7/493* (2013.01); *H02M 1/088* (2013.01); *H01L 23/367* (2013.01); *H01L 25/18* (2013.01); *H01L 27/0259* (2013.01); *H01L 27/0266* (2013.01); *H02H 1/0007* (2013.01); *H02H 3/021* (2013.01); *H02H 3/16* (2013.01); *H02M 1/32* (2013.01); *H02M 7/003* (2013.01); *H03K 17/0828* (2013.01); *H03K 17/28* (2013.01)

(58) Field of Classification Search
CPC ....... H02M 7/493; H02M 2007/53876; H02M 2007/53878; H02M 1/32; H02M 2007/4822; H02M 1/08; H02M 1/084; H02M 1/088; H02M 7/48; H02M 7/53; H02M 7/53875; H02M 7/003
See application file for complete search history.

(56) References Cited

U.S. PATENT DOCUMENTS

2009/0289691 A1    11/2009    Fuller et al.
2013/0155745 A1    6/2013     Tanaka et al.
(Continued)

FOREIGN PATENT DOCUMENTS

DE    10 2017 108 305 A1    10/2017
JP    2011-120330 A         6/2011
(Continued)

OTHER PUBLICATIONS

Ito Norikazu, et al., English Translation of "Inverter device and air conditioner with the same", Jun. 16, 2011.*

(Continued)

*Primary Examiner* — Alex Torres-Rivera
(74) *Attorney, Agent, or Firm* — Studebaker & Brackett PC

(57) ABSTRACT

Provided is a technique for reducing the size and cost of a semiconductor device. A semiconductor device includes an IGBT module having an IGBT, and a MOSFET module having a MOSFET whose operational property is different from that of the IGBT, the MOSFET module being connected to the IGBT module in parallel. The semiconductor device is capable of selectively executing an operation mode in which switching timing in the IGBT module and switching timing in the MOSFET module are non-identical.

13 Claims, 6 Drawing Sheets

(51) Int. Cl.
*H02M 1/32* (2007.01)
*H02M 7/00* (2006.01)
*H01L 23/367* (2006.01)
*H01L 25/18* (2006.01)
*H01L 27/02* (2006.01)
*H02H 1/00* (2006.01)
*H02H 3/02* (2006.01)
*H02H 3/16* (2006.01)
*H03K 17/082* (2006.01)
*H03K 17/28* (2006.01)

(56) References Cited

U.S. PATENT DOCUMENTS

| | | | | |
|---|---|---|---|---|
| 2014/0376268 | A1* | 12/2014 | Manthe | B23K 9/1043 363/17 |
| 2016/0020684 | A1* | 1/2016 | Imai | H02H 7/1206 363/132 |
| 2016/0352243 | A1* | 12/2016 | Okamoto | H05K 1/0265 |
| 2017/0301662 | A1* | 10/2017 | Kimura | H01L 23/49548 |
| 2017/0302153 | A1 | 10/2017 | Mochiki et al. | |
| 2018/0091061 | A1* | 3/2018 | Sakakibara | H02M 7/5395 |
| 2018/0138901 | A1* | 5/2018 | Mollov | H03K 17/145 |
| 2018/0183350 | A1* | 6/2018 | Kadota | H02M 7/003 |
| 2018/0375457 | A1* | 12/2018 | Kitamura | H02M 7/48 |
| 2020/0186074 | A1* | 6/2020 | Ghaderi | H02M 7/5387 |

FOREIGN PATENT DOCUMENTS

| | | |
|---|---|---|
| JP | 2013-125806 A | 6/2013 |
| JP | 2014-090006 A | 5/2014 |

OTHER PUBLICATIONS

An Office Action; "Notice of Reasons for Refusal," mailed by the Japanese Patent Office dated Sep. 15, 2020, which corresponds to Japanese Patent Application No. 2017-216069 and is related to U.S. Appl. No. 16/132,095 with English language translation.

An Office Action issued by the German Patent Office dated Jun. 14, 2021, which corresponds to German Patent Application No. 10 2018 217 867.4 and is related to U.S. Appl. No. 16/132,095 with English language translation.

* cited by examiner

SEMICONDUCTOR DEVICE AND METHOD FOR DRIVING THE SAME

BACKGROUND OF THE INVENTION

Field of the Invention

The present invention relates to semiconductor devices including power semiconductor switching elements and to methods for driving the same.

Description of the Background Art

Parallel connection between an insulated-gate bipolar transistor (IGBT) and a metal-oxide-semiconductor field-effect transistor (MOSFET) has been proposed as a technique for reducing loss generated in a power semiconductor element (e.g., Japanese Patent Application Laid-Open No. 2011-120330).

Some semiconductor devices are constructed in a discrete form of power semiconductor elements; others are constructed in a semiconductor module form, such as packaged modules. In the discrete form, a large number of components cause more complicated assembly and a more complicated pattern of substrate wiring. On the other hand, in the semiconductor module form, design is performed to establish an independent output in a gate driver, to reflect restrictions on wire-bonding, and to provide a gate wire with an additional resistor, in order to control the separation of current flowing through two power transistors.

The technique in Japanese Patent Application Laid-Open No. 2011-120330 is established based on the fact that both IGBT and MOSFET to which the same driving signal (PWM signal) is input and operate at the same time. Unfortunately, variations in element property can cause timing shifts between the turn-on and turn-off operations of the IGBT and the MOSFET in a practical product. For a significant shift, the MOSFET can be turned on earlier than the IGBT, and thus receives a greater current than the IGBT.

Here, an exemplary configuration is provided in which positively using a parasitic diode in the MOSFET as a freewheeling diode prevents this phenomenon. However, this configuration requires the parasitic diode to have a high capability of energization (VF-IF properties), so that the MOSFET has a sufficient capacity of current. Unfortunately, this increases the chip size and substrate area of the MOSFET, and by extension, increases cost. Such a problem is found not only in the IGBT and the MOSFET, but also in the power semiconductor switching elements with operational properties different from each other.

SUMMARY

To solve the problem, it is an object of the present invention to provide a technique for reducing the size and cost of a semiconductor device.

An aspect of the present invention provides a semiconductor device including a first power semiconductor module and a second power semiconductor module. The first power semiconductor module includes a first power semiconductor switching element. The second power semiconductor module includes a second power semiconductor switching element whose operational property is different from that of the first power semiconductor switching element. The second power semiconductor module is connected to the first power semiconductor module in parallel. The semiconductor device is capable of selectively executing an operational mode in which switching timing in the first power semiconductor module and switching timing in the second power semiconductor module are non-identical.

Such a configuration reduces the size and cost of the semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
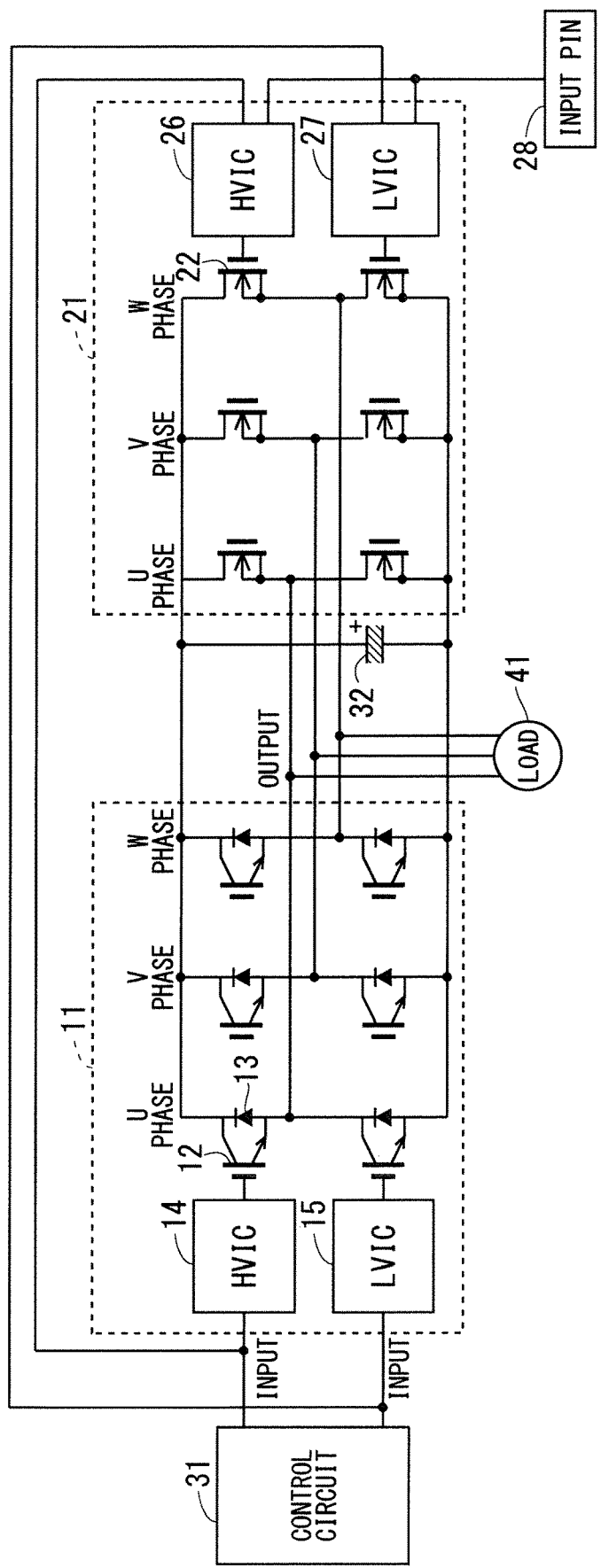
FIG. 1 is a circuit diagram illustrating the configuration of a semiconductor device according to a first preferred embodiment.

FIG. 1 is a circuit diagram illustrating the configuration of a semiconductor device according to a first preferred embodiment of the present invention. The semiconductor device in FIG. 1 includes a first power semiconductor module, which in this preferred embodiment is an insulated-gate bipolar transistor (IGBT) module 11, a second power semiconductor module, which in this preferred embodiment is a metal-oxide-semiconductor field-effect transistor (MOSFET) module 21, a control circuit 31, and an electrolytic capacitor 32.

The control circuit 31 is a microcomputer for instance, and controls the IGBT module 11 and the MOSFET module 21.

The IGBT module 11 and the MOSFET module 21 have inputs connected to the control circuit 31. The IGBT module 11 and the MOSFET module 21 have outputs connected to a load 41, such as a motor. In this way, the MOSFET module 21 according to the first preferred embodiment is connected to the IGBT module 11 in parallel between the input and output of the IGBT module 11.

The IGBT module 11 includes first power semiconductor switching elements, which in this preferred embodiment are IGBTs 12, freewheeling diodes 13, a high-voltage driver 14, such as a high-voltage integrated circuit (HVIC), and a low-voltage driver 15, such as a low-voltage integrated circuit (LVIC).

Two of the IGBTs 12 connected in series between one end and the other end of the electrolytic capacitor 32 constitute an arm. This arm is provided for each of a U phase, a V phase, and a W phase. The high-voltage driver 14 is connected to the gates of the IGBTs 12 on the high-voltage side in the individual arms, and drives the high-voltage IGBTs 12. The low-voltage driver 15 is connected to the gates of the IGBTs 12 on the low-voltage side in the individual arms, and drives the low-voltage IGBTs 12. In each arm, a voltage between the high-voltage IGBT 12 and the low-voltage IGBT 12 is output to the load 41 as an output voltage of the IGBT module 11. Each freewheeling diode 13 is connected to the corresponding IGBT 12 in parallel between the collector and emitter of the IGBT 12.

The MOSFET module 21 includes second power semiconductor switching elements, which in this preferred embodiment are MOSFETs 22, a high-voltage driver 26, such as an HVIC, a low-voltage driver 27, such as an LVIC, and an input pin 28.

Two of the MOSFETs 22 connected in series between one end and the other end of the electrolytic capacitor 32 constitute an arm. This arm is provided for each of a U phase, a V phase, and a W phase. The high-voltage driver 26 is connected to the bases of the MOSFETs 22 on the high-voltage side in the individual arms, and drives the high-voltage MOSFETs 22. The low-voltage driver 27 is connected to the bases of the MOSFETs 22 on the low-voltage side in the individual arms, and drives the low-voltage MOSFETs 22. In each arm, a voltage between the high-voltage MOSFET 22 and the low-voltage MOSFET 22 is output to the load 41 as an output voltage of the MOSFET module 21.

Here, the IGBT 12 and the MOSFET 22 have different operational properties from each other; thus, the turn-on operation of the MOSFET 22 is unfavorable when the IGBT 12 is not in the on-state. The semiconductor device according to the first preferred embodiment has a configuration preventing this unfavorable phenomenon. The following describes the configuration.

The high-voltage driver 26 and low-voltage driver 27 of the MOSFET module 21 has the input pin 28 to which a signal is input for executing an operation mode from, for instance, the outside of the semiconductor device. The high-voltage driver 26 and the low-voltage driver 27, by extension, the MOSFET module 21 has, as an operation mode, a function of changing a time period for signal transmission from the input to output of the MOSFET module 21 in response to the signal as input.

Figure 2:
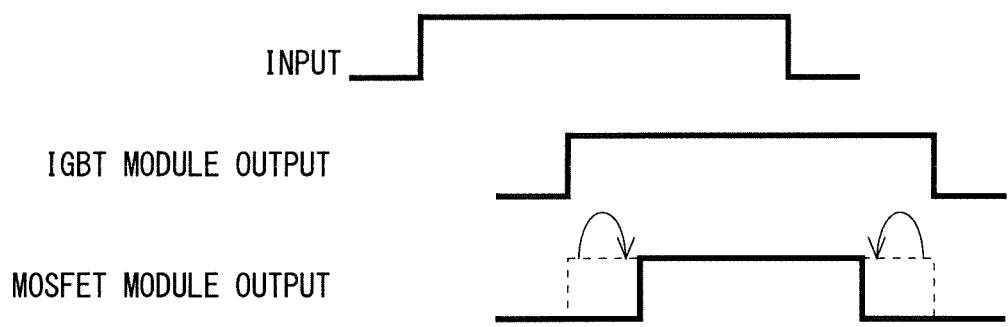
FIG. 2 is a timing chart illustrating an operation mode according to the first preferred embodiment.

FIG. 2 is a timing chart illustrating the operation mode. For operation-mode non-execution, the IGBT module 11 and the MOSFET module 21 are turned on at approximately the same timing, and are also turned off at approximately the same timing, as indicated by broken lines in FIG. 2. For operation-mode execution, the MOSFET module 21 is turned on after the IGBT module 11 is turned on, and also the IGBT module 11 is turned off after the MOSFET module 21 is turned off, as indicated by solid lines in FIG. 2.

As describes above, the semiconductor device according to the first preferred embodiment can selectively execute the operation mode in which the switching timing in the IGBT module 11 and the switching timing in the MOSFET module 21 are non-identical.

The semiconductor device according to the first preferred embodiment prevents the MOSFET 22 from being turned on when the IGBT 12 is in the off-state. Consequently, the MOSFET 22 has a small chip size, thereby reducing the size and cost of the semiconductor device. In addition, signal input to the input pin 28 alone reduces generated loss.

It is noted that providing the IGBT 12 and the MOSFET 22 within a single package relieves restrictions on wiring between the high-voltage drivers 14 and 26 or the low-voltage drivers 15 and 27, and the gate of the IGBT 12 or the base of the MOSFET 22, and relieves restrictions on a main current through a wire-bonding region. This certainly simplifies the design and control of the semiconductor device. Moreover, the IGBT module 11 and the MOSFET module 21 can be disposed on a single substrate. Such a shared substrate certainly reduces the cost as well.

The first preferred embodiment describes that the first power semiconductor switching element is an IGBT; and the second power semiconductor switching element, a MOSFET. However, the first and second power semiconductor switching elements may be any other power semiconductor switching element as long as these switching elements have different operational properties from each other. For instance, the first power semiconductor switching element may be a reverse-conducting IGBT (RC-IGBT); and the second power semiconductor switching element, a MOSFET.

Second Preferred Embodiment

Figure 3:
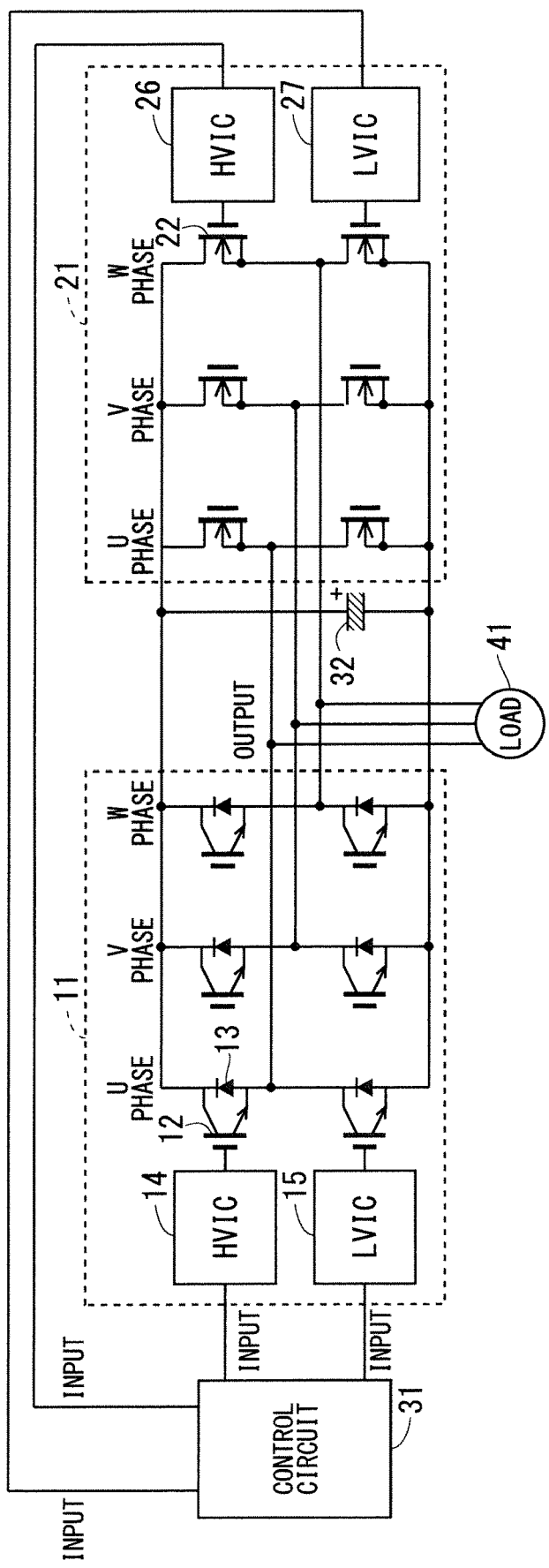
FIG. 3 is a circuit diagram illustrating the configuration of a semiconductor device according to a second preferred embodiment.

FIG. 3 is a circuit diagram illustrating the configuration of a semiconductor device according to a second preferred embodiment of the present invention. The same or similar components between the first and second preferred embodiments are denoted by the same reference signs. Thus, mainly described are components different between the preferred embodiments.

The MOSFET module 21 according to the second preferred embodiment does not include the input pin 28. Instead, the MOSFET module 21 according to the second preferred embodiment is connected to the IGBT module 11 in parallel between the control circuit 31 and the outputs of the IGBT module 11.

This enables the control circuit 31 to input, to the MOSFET module 21, a signal different from a signal input to the IGBT module 11. In the second preferred embodiment, the IGBT module 11 and the MOSFET module 21 can selectively execute the operation mode in response to the signal from the control circuit 31, which is described in the first preferred embodiment.

Like the semiconductor device according to the first preferred embodiment, the semiconductor device according to the second preferred embodiment reduces its size and cost even when the MOSFET module 21 is a general-purpose module having no operation mode, and by extension, having no input pin 28.

Third Preferred Embodiment

Figure 4:
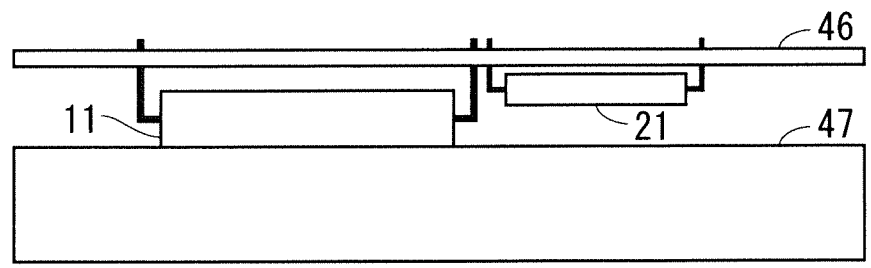
FIG. 4 is a side view of the configuration of a semiconductor device according to a third preferred embodiment.

FIG. 4 is a side view of the configuration of a semiconductor device according to a third preferred embodiment of the present invention. The same or similar components between the third preferred embodiment and the first and second preferred embodiments are denoted by the same reference signs. Thus, mainly described are components different between the preferred embodiments.

The semiconductor device according to the third preferred embodiment includes a substrate 46 and a heat-dissipation fin 47 in addition to the components in the first or second preferred embodiment.

The IGBT module 11 and the MOSFET module 21 are disposed on one surface of the substrate 46. Here, the MOSFET module 21 has a switching loss of substantial zero in the configurations in the first and second preferred embodiments. In this case, the MOSFET module 21 has a relatively small package size or a relatively small rated current, have relatively little generated loss, and involves a relatively small rise in temperature.

Reflecting these effects, the third preferred embodiment provides, with respect to the package size or the rated current, a configuration in which the IGBT module 11 is larger than the MOSFET module 2 and the MOSFET module 21 is not in contact with the heat-dissipation fin 47. That is, the third preferred embodiment provides a configuration in which no heat-dissipation fin is in contact with the MOSFET module 21. Such a configuration prevents the MOSFET module 21 from obstructing contact between the IGBT module 11 and the heat-dissipation fin 47. This eliminates, for instance, the need for height adjustment between the IGBT module 11 and the MOSFET module 21 for establishing such contact. In addition, reducing spacers and the volume of the heat-dissipation fin 47 for establishing the contact certainly further reduces the size and cost of the semiconductor device.

Fourth Preferred Embodiment

Figure 5:
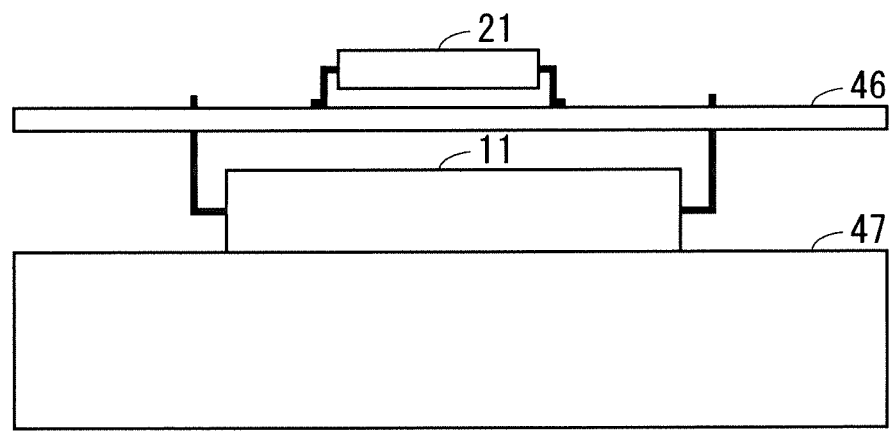
FIG. 5 is a side view of the configuration of a semiconductor device according to a fourth preferred embodiment.

FIG. 5 is a side view of the configuration of a semiconductor device according to a fourth preferred embodiment of the present invention. The same or similar components between the fourth preferred embodiment and the first to third preferred embodiments are denoted by the same reference signs. Thus, mainly described are components different between the preferred embodiments.

In the fourth preferred embodiment, the MOSFET module 21 is mounted on a surface of the substrate 46; moreover, the IGBT module 11 is mounted on the substrate 46 with the substrate 46 interposed between the IGBT module 11 and the MOSFET module 21. In other words, the IGBT module 11 and the MOSFET module 21 are connected to each other in parallel and mounted in parallel with each other with the substrate 46 interposed therebetween. The IGBT module 11 is connected to the heat-dissipation fin 47 on a surface of the IGBT module 11, the surface being remote from the substrate 46.

Such a configuration according to the fourth preferred embodiment enhances an assembly ability in a surface-mounted package. Moreover, this configuration further reduces the area of the substrate 46 than the corresponding configuration according to the third preferred embodiment. In addition, a uniform pin-arrangement between the modules for close arrangement of pins simplifies wiring on the substrate 46. Consequently, a wiring pattern is simply designed.

Fifth Preferred Embodiment

Figure 6:
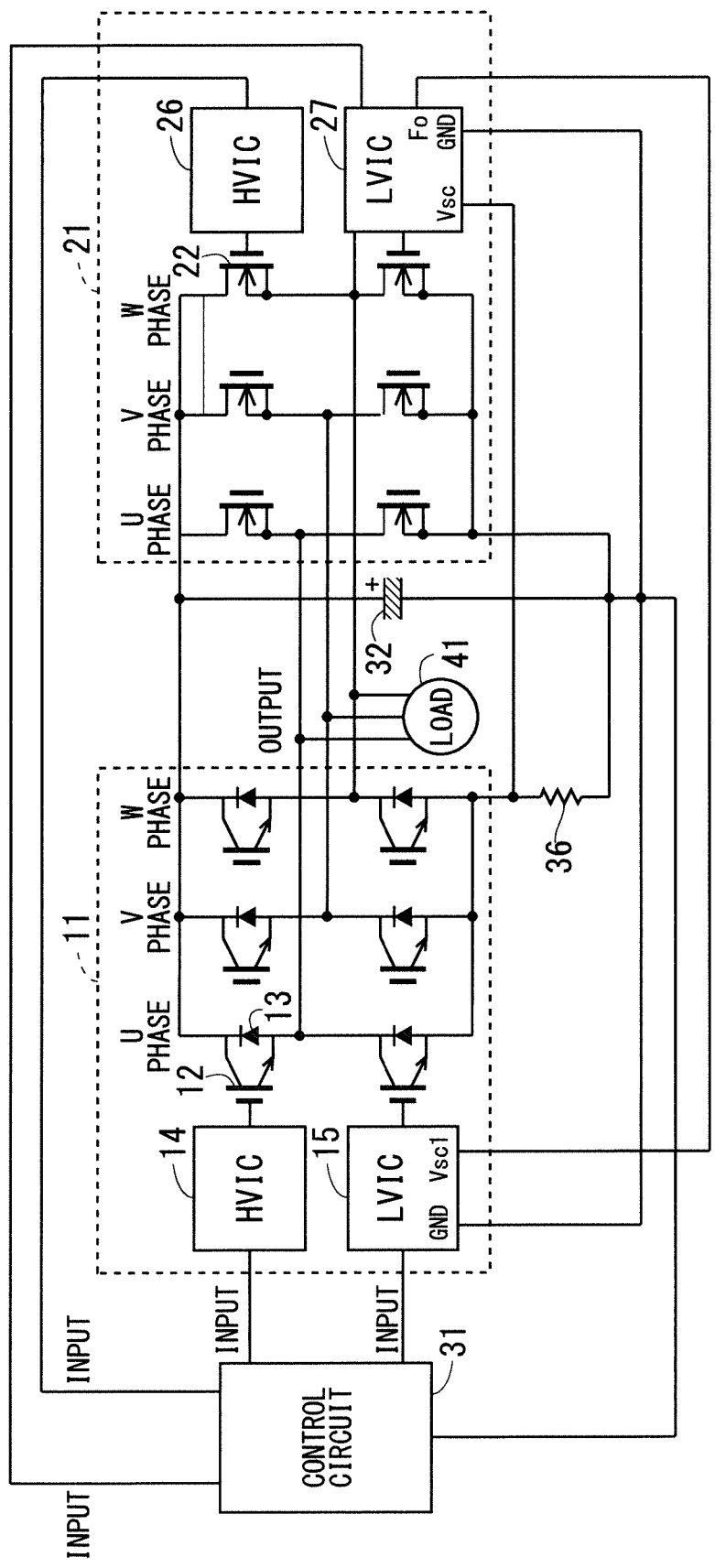
FIG. 6 is a circuit diagram illustrating the configuration of a semiconductor device according to a fifth preferred embodiment.

FIG. 6 is a circuit diagram illustrating the configuration of a semiconductor device according to a fifth preferred embodiment of the present invention. The same or similar components between the fifth preferred embodiment and the first to fourth preferred embodiments are denoted by the same reference signs. Thus, mainly described are components different between the preferred embodiments.

The semiconductor device in the fifth preferred embodiment includes a shunt resistor 36 in addition to the components in the second preferred embodiment. The shunt resistor 36 is connected between the source of the MOSFET 22 and a terminal Vsc of the low-voltage driver 27 within the MOSFET module 21. Here, a short circuit in the semiconductor device according to the fifth preferred embodiment changes a voltage across the shunt resistor 36. The low-voltage driver 27 can detect whether the semiconductor device has a short circuit on the basis of a change in voltage across the shunt resistor 36.

Figure 7:
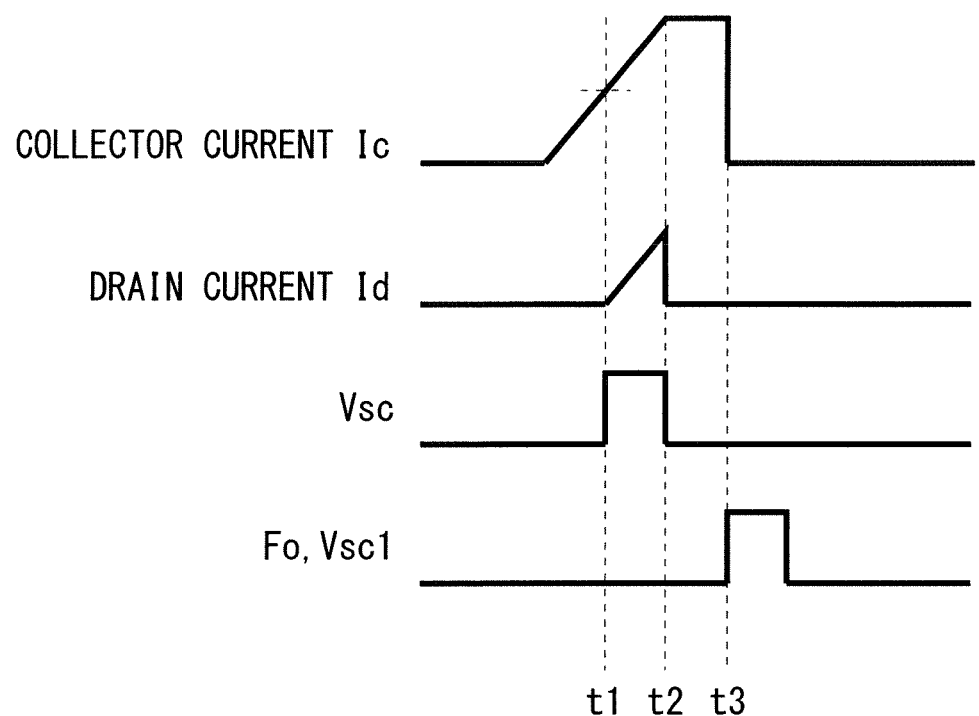
FIG. 7 is a timing chart showing the operation of the semiconductor device according to the fifth preferred embodiment.

FIG. 7 is a timing chart showing the operation of the semiconductor device according to the fifth preferred embodiment. FIG. 7 shows a collector current Ic in the IGBT 12 corresponding to an output current through the IGBT module 11, a drain current Id through the MOSFET 22 corresponding to an output current through the MOSFET module 21, a voltage at the terminal Vsc corresponding to the voltage across the shunt resistor 36, a voltage at a terminal Fo, and a voltage at a terminal Vsc1. The following description labels the voltage at the terminal Vsc as a terminal voltage Vsc, the voltage at the terminal Fo as a terminal voltage Fo, and the voltage at the terminal Vsc1 as a terminal voltage Vsc1. It is noted that the terminal Fo of the low-voltage driver 27 is connected to the terminal Vsc1 of the low-voltage driver 15, as illustrated in FIG. 6, and that the terminal voltage Fo and the terminal voltage Vsc1 are thus substantially the same.

Upon the occurrence of a short circuit in the semiconductor device, thus causing the collector current Ic to exceed a threshold value, the terminal voltage Vsc is turned on at a time t1 in FIG. 7. The low-voltage driver 27 in the MOSFET module 21 interrupts the output of the MOSFET module 21 in accordance with the turn-on of the terminal voltage Vsc. Consequently, the drain current Id through the MOSFET 22 is interrupted at a time t2.

The low-voltage driver 27 in the MOSFET module 21 outputs an error signal for turning the terminal voltage Fo on at a time t3 after a lapse of, from the time t2, a certain time period that is sufficient to interrupt the drain current Id through the MOSFET 22. Accordingly, the low-voltage driver 15 in the IGBT module 11 receives the error signal for turning the terminal voltage Vsc1 on. The low-voltage driver 15 that has received the error signal interrupts the output of the IGBT module 11. Consequently, the collector current Ic through the IGBT 12 is interrupted.

In the semiconductor device according to the fifth preferred embodiment, the output of the MOSFET module 21 and the output of the IGBT module 11 are sequentially interrupted. Such a configuration prevents a short-circuit current from flowing into the MOSFET 22, thereby reducing the size and cost of the semiconductor device. It is noted that the fifth preferred embodiment, although applied to the second preferred embodiment in the above description, may be applied to the first preferred embodiment.

Others

The MOSFET module 21 according to the first to fifth preferred embodiments may be formed of a wide-bandgap semiconductor made of a material, such as silicon carbide (SiC) or gallium nitride (GaN). A MOSFET formed of a wide-bandgap semiconductor reduces generated loss when compared to a MOSFET made of Si. This reduces the size and cost of the MOSFET module 21.

It is noted that in the present invention, the individual embodiments and modifications can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a first power semiconductor module comprising a first power semiconductor switching element; and a second power semiconductor module comprising a second power semiconductor switching element whose operational property is different from an operational property of the first power semiconductor switching element, the second power semiconductor module being connected to the first power semiconductor module in parallel, the semiconductor device being capable of switching between,
execution of an operation mode in which switching timing in the first power semiconductor module and switching timing in the second power semiconductor module are non-identical, and
non-execution of the operation mode such that the switching timing in the first power semiconductor module and the switching timing in the second power semiconductor module are more similar to each other than in the operation mode,
wherein the semiconductor device delays turning on the second power semiconductor module until after the first power semiconductor module is turned on from an off state, when the semiconductor device switches from the non-execution of the operation mode to the execution of the operation mode, such that the first power semiconductor module and the second power semiconductor module are both on at the same time within a time period during the execution of the operation mode.

2. The semiconductor device according to claim 1, wherein the second power semiconductor module further comprises an input pin to which a signal is input for executing the operation mode.

3. The semiconductor device according to claim 1, wherein the first power semiconductor module and the second power semiconductor module are configured to switch between the execution of the operation mode and the non-execution of the operation mode in response to a signal from a control circuit configured to control the first power semiconductor module and the second power semiconductor module.

4. The semiconductor device according to claim 1, wherein
with respect to a package size or a rated current, the first power semiconductor module is larger than the second power semiconductor module, and
no heat-dissipation fin is in contact with the second power semiconductor module.

5. The semiconductor device according to claim 1, further comprising a substrate,
wherein the second power semiconductor module is mounted on a surface of the substrate, and
the first power semiconductor module is mounted on the substrate with the substrate interposed between the first power semiconductor module and the second power semiconductor module.

6. The semiconductor device according to claim 1, wherein when a short circuit occurs in the semiconductor device, an output interruption in the second power semiconductor module and an output interruption in the first power semiconductor module are sequentially performed.

7. The semiconductor device according to claim 1, wherein when the operation mode is executed, the first power semiconductor module is turned off after the second power semiconductor module is turned off at the end of the time period.

8. The semiconductor device according to claim 1, wherein the second power semiconductor module comprises a wide-bandgap semiconductor.

9. The semiconductor device according to claim 1, wherein
the first power semiconductor switching element is an IGBT or an RC-IGBT, and
the second power semiconductor switching element is a MOSFET.

10. A method for driving a semiconductor device,
the semiconductor device comprising
a first power semiconductor module comprising a first power semiconductor switching element, and
a second power semiconductor module comprising a second power switching element whose operation property is different from an operation property of the first power semiconductor switching element, the second power semiconductor module being connected to the first power semiconductor module in parallel, the method being capable of switching between,
execution of an operation mode in which switching timing in the first power semiconductor module and switching timing in the second power semiconductor module are non-identical, and
non-execution of the operation mode such that the switching timing in the first power semiconductor module and the switching timing in the second power semiconductor module are more similar to each other than in the operation mode,
wherein the semiconductor device delays turning on the second power semiconductor module until after the first power semiconductor module is turned on from an off state, when the semiconductor device switches from the non-execution of the operation mode to the execution of the operation mode, such that the first power semiconductor module and the second power semiconductor module are both on at the same time within a time period during the execution of the operation mode.

11. The method according to claim 10, wherein when the operation mode is executed, the first power semiconductor module is turned off after the second power semiconductor module is turned off at the end of the time period.

12. A semiconductor device comprising:
a first power semiconductor module comprising a first power semiconductor switching element; and
a second power semiconductor module comprising a second power semiconductor switching element whose operational property is different from an operational property of the first power semiconductor switching element, the second power semiconductor module being connected to the first power semiconductor module in parallel,
the semiconductor device being capable of selectively executing an operation mode in which switching timing in the first power semiconductor module and switching timing in the second power semiconductor module are non-identical,
wherein at least one active feature of the switching timing of one or both of the first power semiconductor module and the second power semiconductor module while conducting current in response to a driving signal changes based on the selectively executing the operation mode,
wherein the semiconductor device delays turning on the second power semiconductor module until after the first power semiconductor module is turned on from an off state, when the semiconductor device switches from the non-execution of the operation mode to the execution of the operation mode, such that the first power semiconductor module and the second power semiconductor module are both on at the same time within a time period during the execution of the operation mode.

13. The semiconductor device according to claim 12, wherein when the operation mode is executed, the first power semiconductor module is turned off after the second power semiconductor module is turned off at the end of the time period.

* * * * *